(12) United States Patent
Bhattacharyya et al.

(10) Patent No.: US 11,450,012 B2
(45) Date of Patent: Sep. 20, 2022

(54) BBP ASSISTED DEFECT DETECTION FLOW FOR SEM IMAGES

(71) Applicant: KLA Corporation, Milpitas, CA (US)

(72) Inventors: Santosh Bhattacharyya, San Jose, CA (US); Ge Cong, Pleasanton, CA (US); Sanbong Park, Dublin, CA (US); Boshi Huang, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 335 days.

(21) Appl. No.: 16/852,359

(22) Filed: Apr. 17, 2020

(65) Prior Publication Data

US 2021/0133989 A1    May 6, 2021

Related U.S. Application Data

(60) Provisional application No. 62/928,513, filed on Oct. 31, 2019.

(51) Int. Cl.
*G06T 7/33* (2017.01)
*G06T 7/00* (2017.01)
(Continued)

(52) U.S. Cl.
CPC .............. *G06T 7/337* (2017.01); *G06F 17/18* (2013.01); *G06K 9/6218* (2013.01);
(Continued)

(58) Field of Classification Search
CPC ............... G06T 7/337; G06T 7/0002; G06T 2207/10061; G06T 2207/20076; G06T 2207/20081; G06T 2207/20084; G06T 7/001; G06T 2207/30148; G06F 17/18; G06K 9/6218; G06K 9/6268; G06K 9/627; G06N 3/08; G06N 20/00; G06N 3/0481; G06N 5/003; G06N 20/20; G06N 3/0445;
(Continued)

(56) References Cited

U.S. PATENT DOCUMENTS 6,427,024 B1 * 7/2002 Bishop ................. G01R 31/311
348/126
8,320,641 B2 * 11/2012 Steinberg ................ G06T 5/008
348/576

(Continued)

FOREIGN PATENT DOCUMENTS

KR    20180137574 A    12/2018
WO    2019190566 A1    10/2019

OTHER PUBLICATIONS

WIPO, ISR for PCT/US2020/057810, Feb. 17, 2021.

*Primary Examiner* — Ali Bayat
(74) *Attorney, Agent, or Firm* — Hodgson Russ LLP

(57) ABSTRACT

A rendered image is aligned with a scanning electron microscope (SEM) image to produce an aligned rendered image. A reference image is aligned with the SEM image to produce an aligned reference image. A threshold probability map also is generated. Dynamic compensation of the SEM image and aligned reference image can produce a corrected SEM image and corrected reference image. A thresholded defect map can be generated and the defects of the thresholded probability map and the signal-to-noise-ratio defects of the thresholded defect map are filtered using a broadband-plasma-based property to produce defect-of-interest clusters.

20 Claims, 6 Drawing Sheets

(51) Int. Cl.
*G06K 9/62* (2022.01)
*G06N 3/08* (2006.01)
*G06N 20/00* (2019.01)
*H01J 37/22* (2006.01)
*H01J 37/28* (2006.01)
*G06F 17/18* (2006.01)

(52) U.S. Cl.
CPC ............ *G06K 9/6268* (2013.01); *G06N 3/08* (2013.01); *G06N 20/00* (2019.01); *G06T 7/0002* (2013.01); *H01J 37/222* (2013.01); *H01J 37/28* (2013.01); *G06T 2207/10061* (2013.01); *G06T 2207/20076* (2013.01); *G06T 2207/20081* (2013.01); *G06T 2207/20084* (2013.01); *H01J 2237/221* (2013.01)

(58) Field of Classification Search
CPC ... G06N 3/0454; G06N 3/0472; H01J 37/222; H01J 37/28; H01J 2237/221; G06V 10/82; G06V 20/69; G06V 2201/06
USPC ......................................... 382/100
See application file for complete search history.

(56) References Cited

U.S. PATENT DOCUMENTS

| | | | |
|---|---|---|---|
| 2004/0052411 A1* | 3/2004 | Qian | G06T 7/0002 430/5 |
| 2017/0228866 A1* | 8/2017 | Jain | H01L 22/20 |
| 2018/0197714 A1 | 7/2018 | Plihal et al. | |
| 2018/0218492 A1 | 8/2018 | Zhang et al. | |
| 2019/0115236 A1 | 4/2019 | Kang | |
| 2020/0126242 A1* | 4/2020 | Fang | H01L 21/67288 |

\* cited by examiner

BBP ASSISTED DEFECT DETECTION FLOW FOR SEM IMAGES

CROSS REFERENCE TO RELATED APPLICATIONS

This application claims priority to U.S. Provisional Application No. 62/928,513, filed on Oct. 31, 2019, the entire disclosure of which is hereby incorporated by reference.

FIELD OF THE DISCLOSURE

The disclosure generally relates to semiconductor defect detection and classification.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it determines the return-on-investment for a semiconductor manufacturer.

One detection algorithm implemented in scanning electron microscope (SEM) tools uses deep learning (DL) exclusively to detect defects-of-interest (DOIs). During training, a user may annotate SEM images to identify defective pixels, and present a set of DOIs and nuisance to the DL network. Three channels of images (e.g., top and two side channels) and a rendered design image may be presented as input to the DL network. Once the DL network has been trained, for a given target location during runtime, a set of SEM images and rendered design images may be fed into the network to determine whether the SEM images contain DOIs.

However, such previous methods are disadvantageous or lack optimal performance for several reasons. If certain defect types are not present during training but appear during runtime, the DL network will not be able to detect such defect types. If insufficient samples of a known defect type appearing against various background geometry are presented during training, the DL network may misclassify such known defects or other defects during runtime. If the DL network is trained during a certain time frame, the DL network performance may degrade as time progresses, due to drastic changes in process variation caused by manufacturing process changes.

Therefore, an improved defect detection flow is needed.

SUMMARY OF THE DISCLOSURE

A method that uses a processor for one or more steps is provided in a first embodiment. A rendered image is aligned with an SEM image to produce an aligned rendered image. A reference image is aligned with the SEM image to produce an aligned reference image. A thresholded probability map is generated by detecting one or more defects in the SEM image and the aligned rendered image and classifying the one or more defects as a defect-of-interest or a nuisance to produce the thresholded probability map. Dynamic compensation is performed on the SEM image and the aligned reference image to produce a corrected SEM image and a corrected reference image. A thresholded defect map is generated by determining a probability distribution from a difference between the SEM image and the aligned reference image and applying an signal-to-noise-ratio threshold to the probability distribution to produce the thresholded defect map. The thresholded defect map comprising signal-to-noise-ratio defects defined as locations in the probability distribution exceeding the signal-to-noise-ratio threshold. The defects of the thresholded probability map and the signal-to-noise-ratio defects of the thresholded defect map are filtered using a broadband-plasma-based property to produce defect-of-interest clusters.

The rendered image can be produced by rendering a vector polygon in a design file to the rendered image. This can include bias-rounding a design polygon to produce the vector polygon. Bias-rounding the design polygon can include iteratively adding a shape bias to the design polygon or rounding a corner of the design polygon.

The reference image can be generated by modifying the rendered image using a generative adversarial network. Modifying the rendered image can modify a top channel, a first side channel, and a second side channel of the rendered image.

The reference image can be generated by modifying the rendered image using a deep learning network based on the rendered image and the SEM image.

The broadband-plasma-based property can include a location window, a defect size, or a care area type.

A system is provided in a second embodiment. The system comprises an SEM including an electron emitter, a detector, and a stage for holding a sample. The SEM is configured to obtain an SEM image of the sample. A processor is in electronic communication with the SEM. The processor is configured to align a rendered image with the SEM image to produce an aligned rendered image and align a reference image with the SEM image to produce an aligned reference image. A thresholded probability map is generated by detecting one or more defects in the SEM image and the aligned rendered image and classifying the one or more defects as a defect-of-interest or a nuisance to produce the thresholded probability map. Dynamic compensation on the SEM image and the aligned reference image is performed to produce a corrected SEM image and a corrected reference image. A thresholded defect map is generated by determining a probability distribution from a difference between the SEM image and the aligned reference image and applying an signal-to-noise-ratio threshold to the probability distribution to produce the thresholded defect map. The thresholded defect map comprises signal-to-noise-ratio defects defined as locations in the probability distribution exceeding the signal-to-noise-ratio threshold. The defects of the thresholded probability map and the signal-to-noise-ratio defects of the thresholded defect map are filtered using a broadband-plasma-based property to produce defect-of-interest clusters.

The rendered image can be produced by rendering a vector polygon in a design file to the rendered image. The processor can be further configured to bias-round a design polygon to produce the vector polygon. Bias-rounding the design polygon can include iteratively adding a shape bias to the design polygon or rounding a corner of the design polygon.

The reference image can be generated by modifying the rendered image using a generative adversarial network. Modifying the rendered image can modify a top channel, a first side channel, and a second side channel of the rendered image.

The reference image can be generated by modifying the rendered image using a deep learning network based on the rendered image and the SEM image.

The broadband-plasma-based property can include a location window, a defect size, or a care area type.

A non-transitory, computer-readable storage medium containing one or more programs is provided in a third embodiment. The one or more programs are configured to execute the following steps on one or more processors. A rendered image is aligned with an SEM image to produce an aligned rendered image. A reference image is aligned with the SEM image to produce an aligned reference image. A thresholded probability map is generated by detecting one or more defects in the SEM image and the aligned rendered image and classifying the one or more defects as a defect-of-interest or a nuisance to produce the thresholded probability map. Dynamic compensation is performed on the SEM image and the aligned reference image to produce a corrected SEM image and a corrected reference image. A thresholded defect map is generated by determining a probability distribution from a difference between the SEM image and the aligned reference image and applying an signal-to-noise-ratio threshold to the probability distribution to produce the thresholded defect map. The thresholded defect map comprises signal-to-noise-ratio defects defined as locations in the probability distribution exceeding the signal-to-noise-ratio threshold. The defects of the thresholded probability map and the signal-to-noise-ratio defects of the thresholded defect map are filtered using a broadband plasma broadband-plasma-based property to produce defect-of-interest clusters.

The rendered image can be produced by rendering a vector polygon in a design file to the rendered image.

The reference image can be generated by modifying the rendered image using a generative adversarial network.

The broadband-plasma-based property can include a location window, a defect size, or a care area type.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments of the present disclosure may include methods, systems, and apparatuses for detecting defects on a semiconductor wafer, improving the accuracy thereof in terms of real defect capture rate and nuisance (e.g., false defect) rate. Embodiments may combine reference image-based detection with DL-based detection. Further, embodiments may utilize broadband plasma (BBP) defect metadata to further refine detecting defects. The metadata may include, inter alia, location, size, polarity, context, and the region of the defect. Embodiments according to the present disclosure may thus improve defect detection accuracy.

Figure 1A:
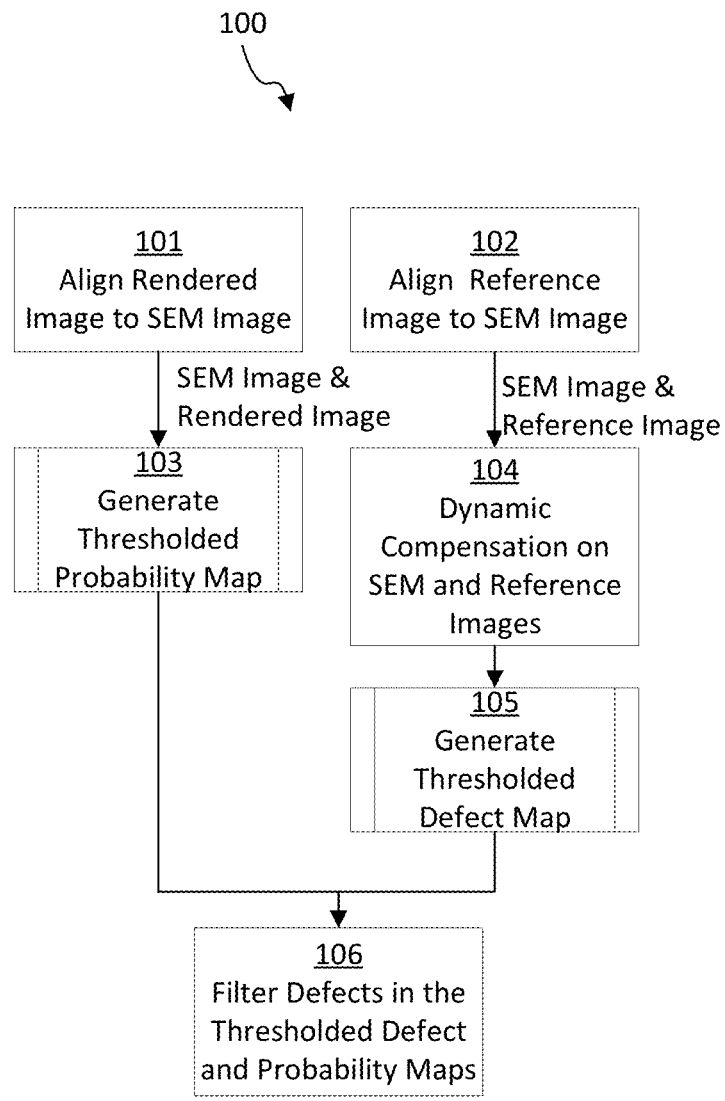
FIG. 1A illustrates an embodiment method for generating a DOI cluster.

In an instance, with reference to FIG. 1A, a method 100 may be performed using a processor (e.g., processor 608). The method 100 may be performed on a single processor, or multiple processors. The method 100 may produce DOI clusters, and the DOI clusters may be stored on an electronic data storage unit (e.g., electronic data storage unit 609). There may be one or more DOI clusters. Each DOI cluster may have one or more defects classified as DOI. The inputs of method 100 may include an SEM image, a design file or a portion thereof, and/or BBP metadata. The output of method 100 may be clusters of defects classified as DOIs. The clusters of defects may be, for example, an image, group of images, table of values, or a defect map (e.g., a graphical representation of defect locations within a die or wafer map).

The SEM image may have a top and two side channels. The design file or portion thereof may be in vector format. BBP metadata may include defect location, defect size, care area group, or other defect attributes.

In some embodiments, a rendered image may be produced by rendering a vector polygon in a design file to the rendered image.

Bias-rounding of a design polygon may be performed to produce the vector polygon.

Figure 2:
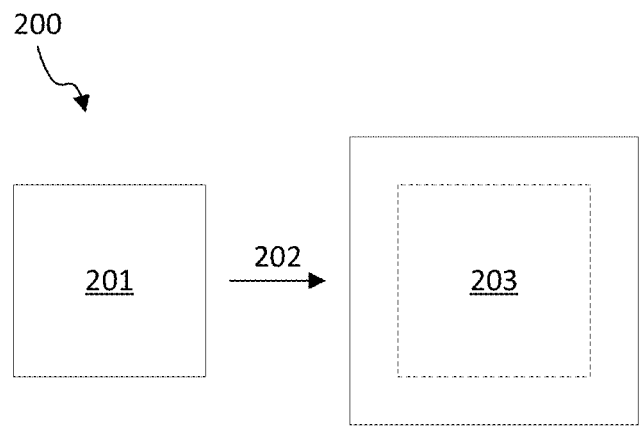
FIG. 2 illustrates an example of adding shape bias.

Bias-rounding the design polygon may include iteratively adding a shape bias to the design polygon, as illustrated for example in FIG. 2. FIG. 2 depicts an example sub-process 200 of adding shape bias. Sub-process 200 may include performing adding, using shape bias operation 202, a shape bias to a design polygon 201, to produce a modified design polygon 203. This modified design polygon 203 may be the vector polygon, or may be used, or corner rounding may also be performed.

Figure 3:
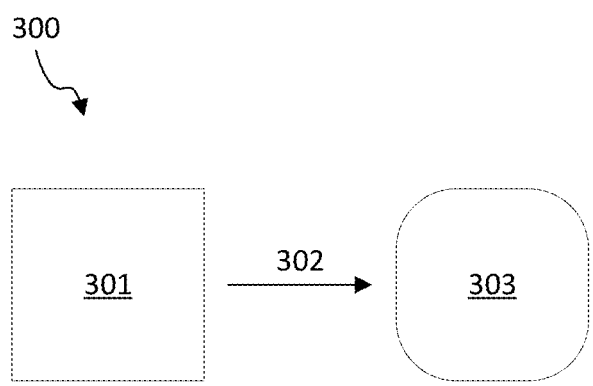
FIG. 3 illustrates an example of adding corner rounding.

Bias-rounding the design polygon may include rounding one or more corners of the design polygon, as illustrated for example in FIG. 3. FIG. 3 depicts an example sub-process 300 of corner rounding. Sub-process 300 may include performing rounding the corners of a design polygon 301 using corner rounding operation 302 to produce a modified design polygon 303, which, in this instance may be larger than design polygon 301, but other operations are possible. This modified design polygon 303 may be the vector polygon, or may be used, or shape bias may also be performed.

Referring again to FIG. 1A, the method 100 may comprise, at 101, aligning a rendered image with an SEM image to produce an aligned rendered image.

Figure 4:
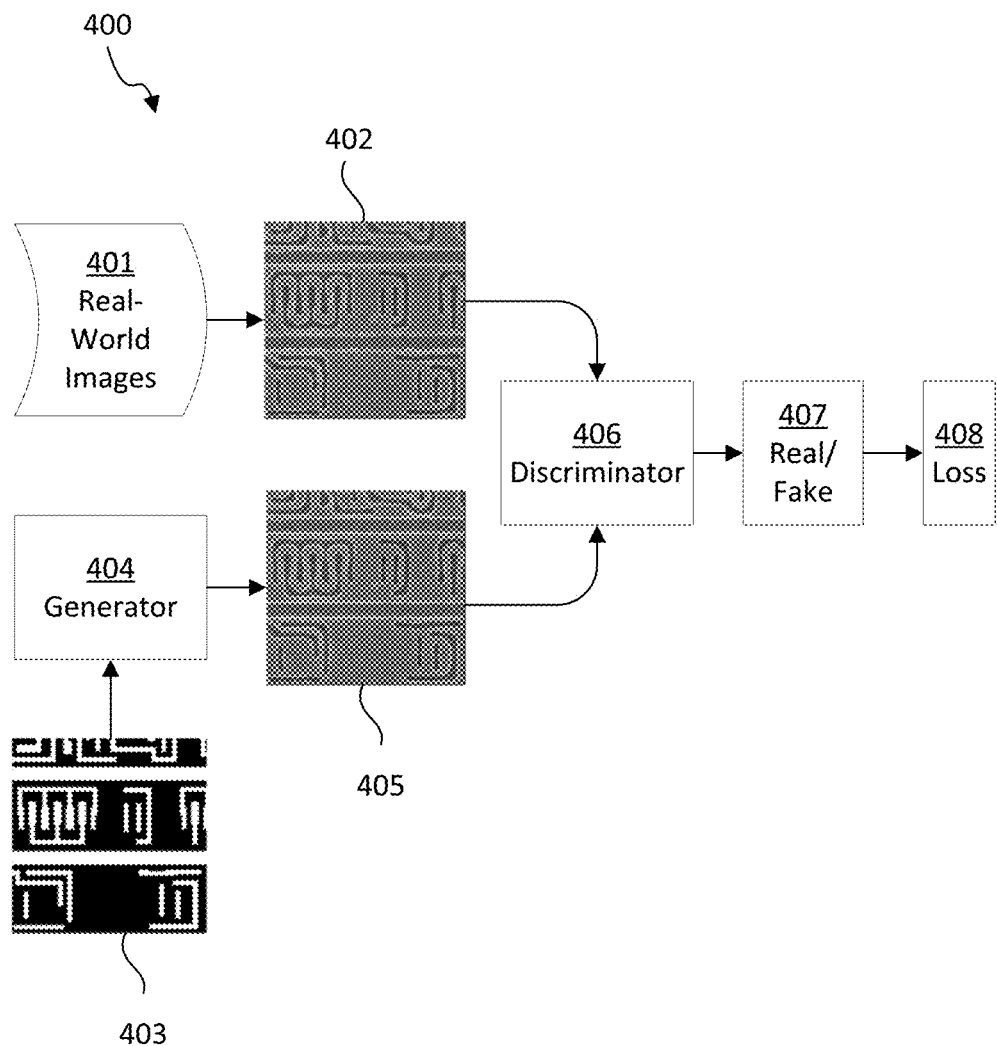
FIG. 4 illustrates an example generative adversarial network.

In some embodiments, a reference image may be generated by modifying the rendered image using a generative adversarial network (GAN), as illustrated for example in FIG. 4. FIG. 4 depicts an example GAN 400. The inputs of GAN 400 may be real-world images 401, of which test image 402 is one, and a design file 403. The design file 403 may be input to a generator 404, which may generate a simulated image 405. The simulated image 405 may be input, with real-world image 402 into discriminator 406, which may determine whether the defects are real (DOI) or fake (nuisance) at 407. This may be used to determine the loss at 408.

The GAN 400 can be trained to generate a "fake" image using a design (e.g., a computer-aided design (CAD) design) as input. A generator network G can generate a "fake" image G(x) from the input (e.g., a SEM image). The discriminator network D can classify real and fake images. D can be trained to correctly classify real versus fake images, which can be represented by maximizing $\log(D(y))+\log(1-D(G(x)))$. G can be trained to minimize error between a real and fake image and to fool the discriminator, which can be represented by minimizing $|y-G(x)|+\log(1-D(G(x)))$. The generator network can include multiple layers. For example, 14 layers may be used.

Modifying the rendered image may include modifying a top channel, a first side channel, and a second side channel of the rendered image.

Figure 5:
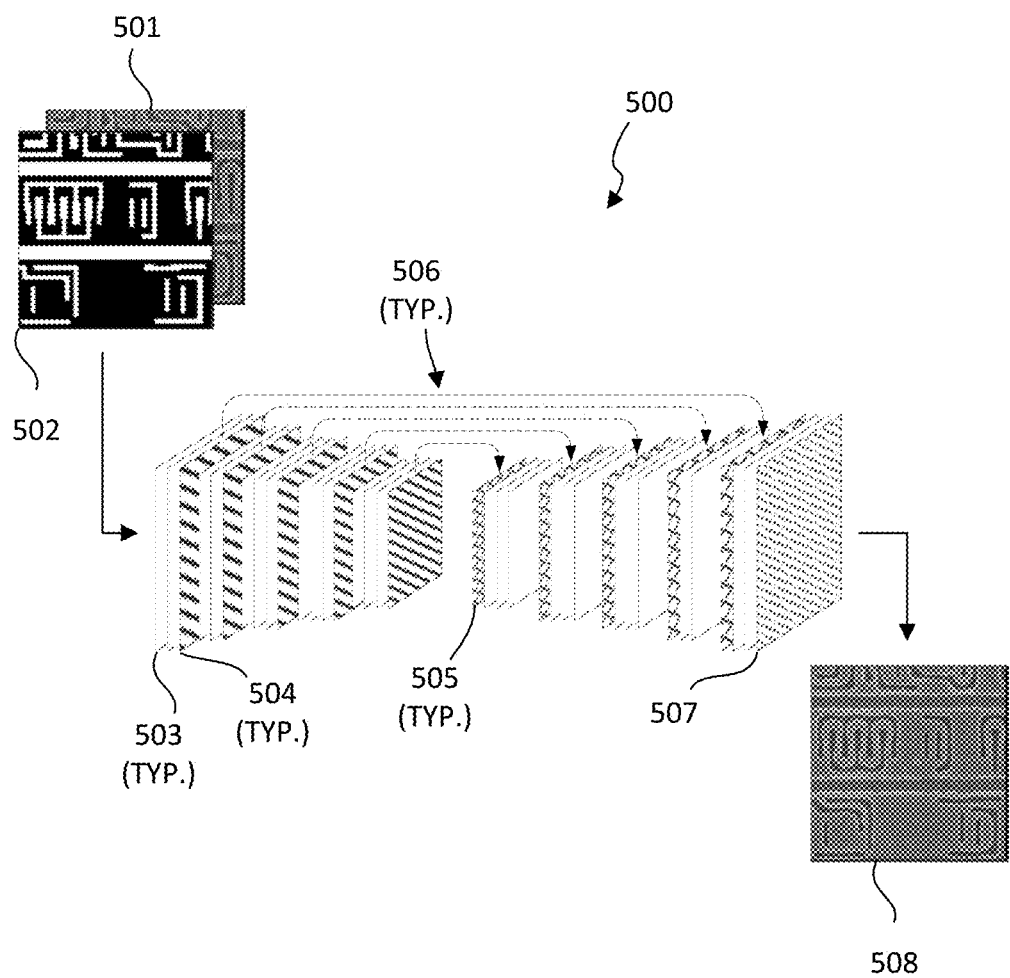
FIG. 5 illustrates an example detection network.

In some embodiments, the reference image may be generated by modifying the rendered image using a DL network based on the rendered image and the SEM image, as illustrated in FIG. 5. FIG. 5 depicts a detection network 500. The detection network 500 may be an unsupervised dynamic learning network. The detection network 500 may take as an input SEM image 501 and a rendered image 502. The SEM image 501 and the rendered image 502 may proceed through a series of convolution/batch normalization/ReLU layers 503, pooling layers 504, and upsampling layers 505. The layers on the downsampling and upsampling portions may correspond with pooling indices 506. There may be a final softmax layer 507. After the conclusion of the network's downsampling and upsampling, reference image 508 may be provided. The detection network 500 may be used instead of a GAN (e.g., GAN 400) to produce a reference image. The detection network 500 can use the image from the GAN (e.g., GAN 400) as an additional reference image channel. The difference image (target SEM minus GAN image) can be used as an additional detection network input.

Referring again to FIG. 1A, at 102, the method 100 may comprise aligning a reference image with the SEM image to produce an aligned reference image.

Figure 1B:
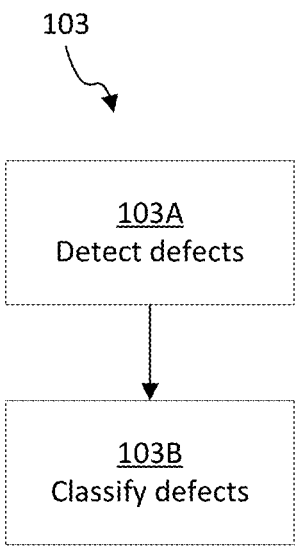
FIG. 1B illustrates an example method for generating a thresholded probability map.

At 103, a threshold probability map may be generated. With reference to FIG. 1B, generating the threshold probability map at 103 may comprise, at 103A, detecting one or more defects in the SEM image and the aligned reference image. Then, at 103B, the one or more defects may be classified as a DOI or a nuisance to produce the threshold probability map. Embodiments disclosed herein can apply BBP feature attributes to the detection network. Embodiments disclosed herein also can apply different feature attributes, such as defect location size, or color, to classification.

Referring again to FIG. 1A, at 104, dynamic compensation may be performed on the SEM image and the aligned reference image to produce a corrected SEM image and a corrected reference image. In an instance, the following formula can be used.

$$\min_{w_j} \sum_{j=1; j \neq i}^{N} [T_i - w_j R_j(x, y)]^2$$

This equation can find the optimal convolutional weights, w, applied to the reference image to minimize the error between it and the target SEM image T. R is the original uncorrected reference image. Optimal weights, $w_{opt}$, are determined. The reference image is convolved with $w_{opt}$ to generate R' prior to subtraction from T. R' is the corrected (or compensated) reference image after convolving R with the optimal weights such that $R'=R*w_{opt}$. Then detection is performed on T, R' using DL a detection network and a signal-to-noise ratio (SNR) outlier detection algorithm in parallel. The outlier detection algorithm can be an adaptive thresholding algorithm.

Figure 1C:
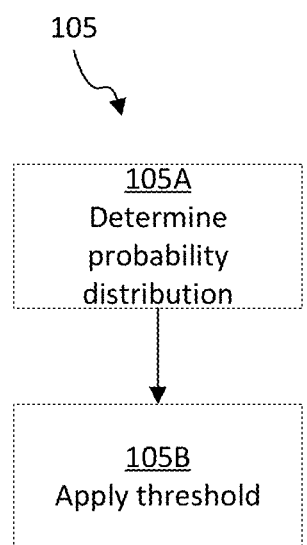
FIG. 1C illustrates an example method for generating a thresholded defect map.

At 105, a thresholded defect map may be generated. With reference to FIG. 1C, generating the thresholded defect map at 105 may comprise, at 105A, determining a probability distribution from a difference between the SEM image and the aligned reference image. Then, at 105B, a SNR threshold may be applied to the probability distribution to produce the thresholded defect map. The thresholded defect map may comprise SNR defects. SNR defects may be locations in the probability distribution exceeding the SNR threshold. The SNR threshold can be set to maximize the DOI detection rate at the maximum allowable nuisance rate. The SNR threshold can vary by application to establish the capture rate and nuisance rate for different products and semiconductor manufacturers. The setting of the SNR threshold is typically established manually during recipe setup to achieve the desired nuisance/capture rates within a process window.

Referring again to FIG. 1A, at 106, the defects of the thresholded probability map and the SNR defects of the thresholded defect map may be filtered using a BBP-based property to produce DOI clusters. Filtration based on care area can be a binary decision (e.g., is the defect inside a BBP care area or not). Filtration based on other BBP attributes can be rule-based (e.g., combinations of deterministic cut-lines on attribute values), or could use a machine learning classifier. The BBP property may include a location window, a defect size, a polarity, context, region, or a care area type. A location window is coordinates of a bounding (x,y) box around defect. Defect size is the maximum x or y dimension of defect. Polarity is the bright or dark (positive or negative) with respect to the non-defective image intensity. Context is an indicator of the type of design pattern defect is located in. For example, some design areas are more susceptible to more serious defects (e.g., "killer" defects) than others. Region is a type or sub-type of inspection area. For example, memory (array) area 1,2,3; logic area 1,2,3; periphery; etc. Care area type includes different types of design generated care areas or manually generated types of care areas tied to different regions.

An embodiment includes applying specific filtering to a difference image depending on defect type, and can be applied to enhance defect signal. This is the differential filter and can be optimized for specific defect types in the difference image. This can be applied to the GAN difference image prior to SNR detection and to the difference channel input to the DL detection network.

An embodiment further segments SEM image to care area of interest can be used to reduce noise in difference image, thus enhancing SNR of DOI. This is segmentation to run more sensitive in low noise regions and run colder in high noise regions instead of fixed sensitivity for the whole region.

In an embodiment, GAN output can be fed into DL detection module to enhance DL results.

In an embodiment, a singular value decomposition-based method can be used to detect DOIs in array structures. This can be an alternative or addition detection method to DL. This also can be applied to SEM imagery.

In another instance, a system (e.g., system 600) may comprise an SEM (e.g., the wafer inspection tool of system 600) and a processor (e.g., processor 608) in electronic communication with the SEM. The SEM may include an electron emitter (e.g., electron beam source 603), a detector (e.g., detector 607), and a stage (e.g., stage 610) for holding a sample (e.g., wafer 604 or another work-piece). The SEM may be configured to obtain an SEM image of the sample.

In an embodiment, spatial morphological operations (e.g., opening, closing, dilation, erosion) can be used to discriminate between different types of defects and nuisance.

An algorithm can be used for bootstrapping during DL training. A classical decision based or thresholding algorithm can be used to help identify defects during initial DL training when there are not enough known and manually-labelled DOI to effectively train the network.

In an embodiment, a singular value decomposition method can be used to detect defects for array-like structures. Singular value decomposition (SVD) can be used to preprocess the SEM images and, therefore, improve the algorithm. SVD decomposes an image into orthogonal components with which optimal sub-rank approximations may be obtained. The largest object components in an image found using the SVD generally correspond to eigen images associated with the largest singular values, while image noise and other trivial features correspond to eigen images associated with the smallest singular values.

Figure 6:
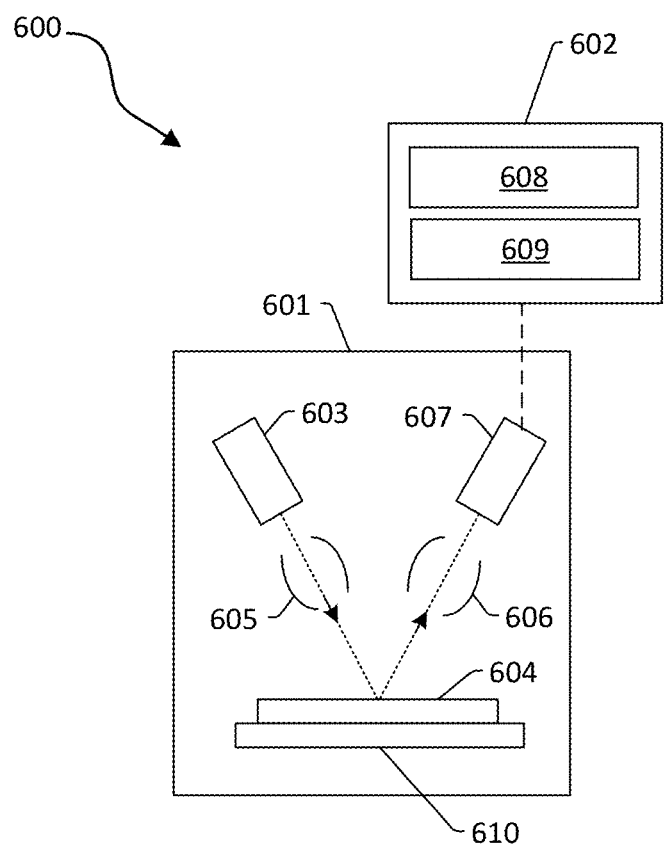
FIG. 6 illustrates an embodiment system.

FIG. 6 is a block diagram of an embodiment of an example system 600. The system 600 includes a wafer inspection tool (which includes the electron column 601) configured to generate images of a wafer 604.

The wafer inspection tool may include an output acquisition subsystem that includes at least an energy source and a detector. The output acquisition subsystem may be an electron beam-based output acquisition subsystem. For example, in one embodiment, the energy directed to the wafer 604 includes electrons, and the energy detected from the wafer 604 includes electrons. In this manner, the energy source may be an electron beam source. In one such embodiment shown in FIG. 6, the output acquisition subsystem may include electron column 601, which may be coupled to computer subsystem 602. A stage 610 may hold the wafer 604.

As also shown in FIG. 6, the electron column 601 may include an electron beam source 603 configured to generate electrons that are focused to wafer 604 by one or more elements 605. The electron beam source 603 may include, for example, a cathode source or emitter tip. The one or more elements 605 may include, for example, a gun lens, an anode, a beam limiting aperture, a gate valve, a beam current selection aperture, an objective lens, and a scanning subsystem, all of which may include any such suitable elements known in the art.

Electrons returned from the wafer 604 (e.g., secondary electrons) may be focused by one or more elements 606 to detector 607. One or more elements 606 may include, for example, a scanning subsystem, which may be the same scanning subsystem included in element(s) 605.

The electron column 601 also may include any other suitable elements known in the art.

Although the electron column 601 is shown in FIG. 6 as being configured such that the electrons are directed to the wafer 604 at an oblique angle of incidence and are scattered from the wafer 604 at another oblique angle, the electron beam may be directed to and scattered from the wafer 604 at any suitable angles. In addition, the electron beam-based output acquisition subsystem may be configured to use multiple modes to generate images of the wafer 604 (e.g., with different illumination angles, collection angles, etc.). The multiple modes of the electron beam-based output acquisition subsystem may be different in any image generation parameters of the output acquisition subsystem.

Computer subsystem 602 may be coupled to detector 607 as described above. The detector 607 may detect electrons returned from the surface of the wafer 604 thereby forming electron beam images of the wafer 604. The electron beam images may include any suitable electron beam images. Computer subsystem 602 may be configured to perform any of the functions described herein using the output of the detector 607 and/or the electron beam images. Computer subsystem 602 may be configured to perform any additional step(s) described herein. A system 600 that includes the output acquisition subsystem shown in FIG. 6 may be further configured as described herein.

It is noted that FIG. 6 is provided herein to generally illustrate a configuration of an electron beam-based output acquisition subsystem that may be used in the embodiments described herein. The electron beam-based output acquisition subsystem configuration described herein may be altered to optimize the performance of the output acquisition subsystem as is normally performed when designing a commercial output acquisition system.

In addition, the systems described herein may be implemented using an existing system (e.g., by adding functionality described herein to an existing system). For some such systems, the methods described herein may be provided as optional functionality of the system (e.g., in addition to other functionality of the system). Alternatively, the system described herein may be designed as a completely new system.

Although the output acquisition subsystem is described above as being an electron beam-based output acquisition subsystem, the output acquisition subsystem may be an ion beam-based output acquisition subsystem. Such an output acquisition subsystem may be configured as shown in FIG. 6 except that the electron beam source may be replaced with any suitable ion beam source known in the art. In addition, the output acquisition subsystem may be any other suitable ion beam-based output acquisition subsystem such as those included in commercially available focused ion beam (FIB) systems, helium ion microscopy (HIM) systems, and secondary ion mass spectroscopy (SIMS) systems.

The computer subsystem 602 includes a processor 608 and an electronic data storage unit 609. The processor 608 may include a microprocessor, a microcontroller, or other devices.

The computer subsystem 602 may be coupled to the components of the system 600 in any suitable manner (e.g., via one or more transmission media, which may include wired and/or wireless transmission media) such that the processor 608 can receive output. The processor 608 may be configured to perform a number of functions using the output. The wafer inspection tool can receive instructions or other information from the processor 608. The processor 608 and/or the electronic data storage unit 609 optionally may be in electronic communication with another wafer inspection tool, a wafer metrology tool, or a wafer review tool (not illustrated) to receive additional information or send instructions.

The processor 608 is in electronic communication with the wafer inspection tool, such as the detector 607. The processor 608 may be configured to process images generated using measurements from the detector 607. For example, the processor may perform embodiments of the methods 100, 400, or 500.

The computer subsystem 602, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

The processor 608 and electronic data storage unit 609 may be disposed in or otherwise part of the system 600 or another device. In an example, the processor 608 and electronic data storage unit 609 may be part of a standalone control unit or in a centralized quality control unit. Multiple processors 608 or electronic data storage units 609 may be used.

The processor 608 may be implemented in practice by any combination of hardware, software, and firmware. Also, its functions as described herein may be performed by one unit, or divided up among different components, each of which may be implemented in turn by any combination of hardware, software and firmware. Program code or instructions for the processor 608 to implement various methods and functions may be stored in readable storage media, such as a memory in the electronic data storage unit 609 or other memory.

If the system 600 includes more than one computer subsystem 602, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 608 may be configured to perform a number of functions using the output of the system 600 or other output. For instance, the processor 608 may be configured to send the output to an electronic data storage unit 609 or another storage medium. The processor 608 may be further configured as described herein.

The processor 608 or computer subsystem 602 may be part of a defect review system, an inspection system, a metrology system, or some other type of system. Thus, the embodiments disclosed herein describe some configurations that can be tailored in a number of manners for systems having different capabilities that are more or less suitable for different applications.

If the system includes more than one subsystem, then the different subsystems may be coupled to each other such that images, data, information, instructions, etc. can be sent between the subsystems. For example, one subsystem may be coupled to additional subsystem(s) by any suitable transmission media, which may include any suitable wired and/or wireless transmission media known in the art. Two or more of such subsystems may also be effectively coupled by a shared computer-readable storage medium (not shown).

The processor 608 may be configured according to any of the embodiments described herein. The processor 608 also may be configured to perform other functions or additional steps using the output of the system 600 or using images or data from other sources.

In an instance, the processor 608 may be in communication with the system 600. The processor 608 may be configured to align a rendered image with the SEM image to produce an aligned rendered image.

The processor 608 may be further configured to align a reference image with the SEM image to produce an aligned reference image.

The processor 608 may be further configured to generate a thresholded probability map by detecting one or more defects in the SEM image and the aligned rendered image and classifying the one or more defects as a DOI or a nuisance to produce the thresholded probability map.

The processor 608 may be further configured to perform dynamic compensation on the SEM image and the aligned reference image to produce a corrected SEM image and a corrected reference image.

The processor 608 may be further configured to generate a thresholded defect map by determining a probability distribution from a difference between the SEM image and the aligned reference image, and applying an SNR threshold to the probability distribution to produce the thresholded defect map, the thresholded defect map comprising SNR defects defined as locations in the probability distribution exceeding the SNR threshold.

The processor 608 may be further configured to filter the defects of the thresholded probability map and the SNR defects of the thresholded defect map using a broadband-plasma-based property to produce DOI clusters.

The rendered image may be produced by rendering a vector polygon in a design file to the rendered image.

The processor 608 may be further configured to bias-round a design polygon to produce the vector polygon. Bias-rounding the design polygon includes iteratively adding a shape bias to the design polygon or rounding a corner of the design polygon.

The reference image may be generated by modifying the rendered image using a GAN. Modifying the rendered image may modify a top channel, a first side channel, and a second side channel of the rendered image.

The reference image may be generated by modifying the rendered image using a deep learning network based on the rendered image and the SEM image.

The broadband-plasma-based property may include a location window, a defect size, or a care area type.

The processor 608 may be communicatively coupled to any of the various components or sub-systems of system 600 in any manner known in the art. Moreover, the processor 608 may be configured to receive and/or acquire data or information from other systems (e.g., inspection results from an inspection system such as a review tool, a remote database including design data and the like) by a transmission medium that may include wired and/or wireless portions. In this manner, the transmission medium may serve as a data link between the processor 608 and other subsystems of the system 600 or systems external to system 600.

Various steps, functions, and/or operations of system 600 and the methods disclosed herein are carried out by one or more of the following: electronic circuits, logic gates, multiplexers, programmable logic devices, ASICs, analog or digital controls/switches, microcontrollers, or computing systems. Program instructions implementing methods such as those described herein may be transmitted over or stored on carrier medium. The carrier medium may include a storage medium such as a read-only memory, a random access memory, a magnetic or optical disk, a non-volatile memory, a solid state memory, a magnetic tape, and the like. A carrier medium may include a transmission medium such as a wire, cable, or wireless transmission link. For instance, the various steps described throughout the present disclosure may be carried out by a single processor 608 (or computer subsystem 602) or, alternatively, multiple processors 608 (or multiple computer subsystems 602). Moreover, different sub-systems of the system 600 may include one or more computing or logic systems. Therefore, the above description should not be interpreted as a limitation on the present disclosure but merely an illustration.

An additional embodiment may be a non-transitory, computer-readable storage medium containing one or more programs configured to execute steps on one or more processors. Such steps may comprise aligning a rendered image with an scanning electron microscope (SEM) image to produce an aligned rendered image. The steps may further comprise aligning a reference image with the SEM image to produce an aligned reference image.

The steps may further comprise generating a thresholded probability map. The thresholded probability map may be generated by detecting one or more defects in the SEM image and the aligned rendered image and classifying the one or more defects as a DOI or a nuisance to produce the thresholded probability map.

The steps may further comprise performing dynamic compensation on the SEM image and the aligned reference image to produce a corrected SEM image and a corrected reference image.

The steps may further comprise generating a thresholded defect map. The thresholded defect map may be generated by determining a probability distribution from a difference between the SEM image and the aligned reference image and applying an SNR threshold to the probability distribution to produce the thresholded defect map, the thresholded defect map comprising SNR defects defined as locations in the probability distribution exceeding the SNR threshold.

The steps may further comprise filtering the defects of the thresholded probability map and the SNR defects of the thresholded defect map using a broadband plasma broadband-plasma-based property to produce DOI clusters.

The rendered image may be produced by rendering a vector polygon in a design file to the rendered image. The reference image may be generated by modifying the rendered image using a GAN.

The broadband-plasma-based property may include a location window, a defect size, or a care area type.

The component(s) executed by the processor, can include a deep learning module (e.g., a convolutional neural network (CNN) module). The deep learning module can have one of the configurations described further herein. Rooted in neural network technology, deep learning is a probabilistic graph model with many neuron layers, commonly known as a deep architecture. Deep learning technology processes the information such as image, text, voice, and so on in a hierarchical manner. In using deep learning in the present disclosure, feature extraction is accomplished automatically using learning from data. For example, features to reference in determining rotation and translation offsets can be extracted using the deep learning module based on the one or more extracted features.

Generally speaking, deep learning (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output, allowing the algorithm to use multiple processing layers, composed of multiple linear and non-linear transformations.

Deep learning is part of a broader family of machine learning methods based on learning representations of data. An observation (e.g., a feature to be extracted for reference) can be represented in many ways such as a vector of intensity values per pixel, or in a more abstract way as a set of edges, regions of particular shape, etc. Some representations are better than others at simplifying the learning task (e.g., face recognition or facial expression recognition). Deep learning can provide efficient algorithms for unsupervised or semi-supervised feature learning and hierarchical feature extraction.

Research in this area attempts to make better representations and create models to learn these representations from large-scale data. Some of the representations are inspired by advances in neuroscience and are loosely based on interpretation of information processing and communication patterns in a nervous system, such as neural coding which attempts to define a relationship between various stimuli and associated neuronal responses in the brain.

There are many variants of neural networks with deep architecture depending on the probability specification and network architecture, including, but not limited to, Deep Belief Networks (DBN), Restricted Boltzmann Machines (RBM), and Auto-Encoders. Another type of deep neural network, a CNN, can be used for feature analysis. The actual implementation may vary depending on the size of input images, the number of features to be analyzed, and the nature of the problem. Other layers may be included in the deep learning module besides the neural networks disclosed herein.

In an embodiment, the deep learning module is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. Machine learning explores the study and construction of algorithms that can learn from and make predictions on data. Such algorithms overcome following strictly static program instructions by making data driven predictions or decisions, through building a model from sample inputs.

In some embodiments, the deep learning module is a generative model. A generative model can be generally defined as a model that is probabilistic in nature. In other words, a generative model is one that performs forward simulation or rule-based approaches. The generative model can be learned (in that its parameters can be learned) based on a suitable training set of data. In one embodiment, the deep learning module is configured as a deep generative model. For example, the model may be configured to have a deep learning architecture in that the model may include multiple layers, which perform a number of algorithms or transformations. A deep learning model can be configured as part of or can be configured to use a GAN.

In another embodiment, the deep learning module is configured as a neural network. In a further embodiment, the deep learning module may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically comprise multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In one embodiment, the deep learning module used for the semiconductor inspection applications disclosed herein is configured as an AlexNet. For example, an AlexNet includes a number of convolutional layers (e.g., 5) followed by a number of fully connected layers (e.g., 3) that are, in combination, configured and trained to analyze features for determining rotation and translation offsets. In another such embodiment, the deep learning module used for the semiconductor inspection applications disclosed herein is configured as a GoogleNet. For example, a GoogleNet may include layers such as convolutional, pooling, and fully connected layers such as those described further herein configured and trained to analyze features for determining rotation and translation offsets. While the GoogleNet architecture may include a relatively high number of layers (especially compared to some other neural networks described herein), some of the layers may be operating in parallel, and groups of layers that function in parallel with each other are generally referred to as inception modules. Other of the layers may operate sequentially. Therefore, GoogleNets are different from other neural networks described herein in that not all of the layers are arranged in a sequential structure. The parallel layers may be similar to Google's Inception Network or other structures.

In a further such embodiment, the deep learning module used for the semiconductor inspection applications disclosed herein is configured as a Visual Geometry Group (VGG) network. For example, VGG networks were created by increasing the number of convolutional layers while fixing other parameters of the architecture. Adding convolutional layers to increase depth is made possible by using substantially small convolutional filters in all of the layers. Like the other neural networks described herein, VGG networks were created and trained to analyze features for determining rotation and translation offsets. VGG networks also include convolutional layers followed by fully connected layers.

In some such embodiments, the deep learning module used for the semiconductor inspection applications disclosed herein is configured as a deep residual network. For example, like some other networks described herein, a deep residual network may include convolutional layers followed by fully-connected layers, which are, in combination, configured and trained for feature property extraction. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart.

In a further such embodiment, the deep learning module used for the semiconductor inspection applications disclosed herein includes one or more fully connected layers configured for analyzing features for determining rotation and translation offsets. A fully connected layer may be generally defined as a layer in which each of the nodes is connected to each of the nodes in the previous layer. The fully connected layer(s) may perform classification based on the features extracted by convolutional layer(s), which may be configured as described further herein. The fully connected layer(s) are configured for feature selection and classification. In other words, the fully connected layer(s) select features from a feature map and then analyze the input image(s) based on the selected features. The selected features may include all of the features in the feature map (if appropriate) or only some of the features in the feature map.

In some embodiments, the information determined by the deep learning module includes feature properties extracted by the deep learning module. In one such embodiment, the deep learning module includes one or more convolutional layers. The convolutional layer(s) may have any suitable configuration known in the art. In this manner, the deep learning module (or at least a part of the deep learning module) may be configured as a CNN. For example, the deep learning module may be configured as a CNN, which is usually stacks of convolution and pooling layers, to extract local features. The embodiments described herein can take advantage of deep learning concepts such as a CNN to solve the normally intractable representation inversion problem. The deep learning module may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

In general, the deep learning module described herein is a trained deep learning module. For example, the deep learning module may be previously trained by one or more other systems and/or methods. The deep learning module is already generated and trained and then the functionality of the module is determined as described herein, which can then be used to perform one or more additional functions for the deep learning module.

As stated above, although a CNN is used herein to illustrate the architecture of a deep learning system, the present disclosure is not limited to a CNN. Other variants of deep learning architectures may be used in embodiments. For example, Auto-Encoders, DBNs, and RBMs, can be used. Random forests also can be used.

Training data may be inputted to module training (e.g., CNN training), which may be performed in any suitable manner. For example, the module training may include inputting the training data to the deep learning module (e.g., a CNN) and modifying one or more parameters of the module until the output of the module is the same as (or substantially the same as) external validation data. Module training may generate one or more trained modules, which may then be sent to module selection, which is performed using validation data. The results that are produced by each one or more trained modules for the validation data that is input to the one or more trained modules may be compared to the validation data to determine which of the modules is the best module. For example, the module that produces results that most closely match the validation data may be selected as the best module. Test data may then be used for module evaluation of the module that is selected (e.g., the best module). Module evaluation may be performed in any suitable manner. Best module may also be sent, to module deployment in which the best module may be sent to the semiconductor inspection tool for use (post-training mode).

The advantages presented by embodiments of the present disclosure may be several. Fusing reference-image-based detection and DL-based detection may improve defect detection accuracy. BBP-assisted detection may enable using defect properties including, inter alia, location, size, polarity, context, and region of the defect to improve defect detection accuracy. Filtering defect types may improve the defect signal, improving defect detection accuracy. Reference generation may create reference images that closely resemble test images, removing a need to capture a reference image from an adjacent die, and thus reducing throughput (e.g., to half of the required throughput). Morphology analysis-based detection may be useful for certain defect types. In the case of a repeated geometric structure, missing—or added—patterns may be detected using a singular value decomposition technique. Classical detection algorithm could be used as a bootstrapping step for DL-based training, enabling feeding in various defect types. Classical defection methods would, when implemented with DL-based training, may be immune to process variation. Classical methods may not require significant training, as there would be no need to learn all defect types or all defect locations. Finally, embodiments of the present disclosure may achieve 95% DOI accuracy and 99%, or 99.9%, nuisance accuracy.

The steps of the method described in the various embodiments and examples disclosed herein are sufficient to carry out the methods of the present invention. Thus, in an embodiment, the method consists essentially of a combination of the steps of the methods disclosed herein. In another embodiment, the method consists of such steps.

Although the present disclosure has been described with respect to one or more particular embodiments, it will be understood that other embodiments of the present disclosure may be made without departing from the scope of the present disclosure.

What is claimed is:

1. A method comprising, using a processor:
   aligning a rendered image with a scanning electron microscope (SEM) image to produce an aligned rendered image;
   aligning a reference image with the SEM image to produce an aligned reference image;
   generating a thresholded probability map by:
     detecting one or more defects in the SEM image and the aligned rendered image; and
     classifying the one or more defects as a defect-of-interest or a nuisance to produce the thresholded probability map;
   performing dynamic compensation on the SEM image and the aligned reference image to produce a corrected SEM image and a corrected reference image;
   generating a thresholded defect map by:
     determining a probability distribution from a difference between the SEM image and the aligned reference image; and
     applying an signal-to-noise-ratio threshold to the probability distribution to produce the thresholded defect map, the thresholded defect map comprising signal-to-noise-ratio defects defined as locations in the probability distribution exceeding the signal-to-noise-ratio threshold; and
   filtering the defects of the thresholded probability map and the signal-to-noise-ratio defects of the thresholded defect map using a broadband-plasma-based property to produce defect-of-interest clusters.

2. The method of claim 1, wherein the rendered image is produced by rendering a vector polygon in a design file to the rendered image.

3. The method of claim 2, further comprising bias-rounding a design polygon to produce the vector polygon.

4. The method of claim 3, wherein bias-rounding the design polygon includes iteratively adding a shape bias to the design polygon or rounding a corner of the design polygon.

5. The method of claim 1, wherein the reference image is generated by modifying the rendered image using a generative adversarial network.

6. The method of claim 5, wherein modifying the rendered image modifies a top channel, a first side channel, and a second side channel of the rendered image.

7. The method of claim 1, wherein the reference image is generated by modifying the rendered image using a deep learning network based on the rendered image and the SEM image.

8. The method of claim 1, wherein the broadband-plasma-based property includes a location window, a defect size, or a care area type.

9. A system, comprising:
   a scanning electron microscope (SEM) including an electron emitter, a detector, and a stage for holding a sample, the SEM configured to obtain an SEM image of the sample; and
   a processor in electronic communication with the SEM, configured to:
     align a rendered image with the SEM image to produce an aligned rendered image;
     align a reference image with the SEM image to produce an aligned reference image;
     generate a thresholded probability map by:
       detecting one or more defects in the SEM image and the aligned rendered image; and
       classifying the one or more defects as a defect-of-interest or a nuisance to produce the thresholded probability map;
     perform dynamic compensation on the SEM image and the aligned reference image to produce a corrected SEM image and a corrected reference image;
     generate a thresholded defect map by:
       determining a probability distribution from a difference between the SEM image and the aligned reference image; and
       applying an signal-to-noise-ratio threshold to the probability distribution to produce the thresholded defect map, the thresholded defect map comprising signal-to-noise-ratio defects defined as locations in the probability distribution exceeding the signal-to-noise-ratio threshold; and
     filter the defects of the thresholded probability map and the signal-to-noise-ratio defects of the thresholded defect map using a broadband-plasma-based property to produce defect-of-interest clusters.

10. The system of claim 9, wherein the rendered image is produced by rendering a vector polygon in a design file to the rendered image.

11. The system of claim 10, wherein the processor is further configured to bias-round a design polygon to produce the vector polygon.

12. The system of claim 11, wherein bias-rounding the design polygon includes iteratively adding a shape bias to the design polygon or rounding a corner of the design polygon.

13. The system of claim 9, wherein the reference image is generated by modifying the rendered image using a generative adversarial network.

14. The method of claim 13, wherein modifying the rendered image modifies a top channel, a first side channel, and a second side channel of the rendered image.

15. The method of claim 9, wherein the reference image is generated by modifying the rendered image using a deep learning network based on the rendered image and the SEM image.

16. The method of claim 9, wherein the broadband-plasma-based property includes a location window, a defect size, or a care area type.

17. A non-transitory, computer-readable storage medium containing one or more programs configured to execute the following steps on one or more processors:
- align a rendered image with an scanning electron microscope (SEM) image to produce an aligned rendered image;
- align a reference image with the SEM image to produce an aligned reference image;
- generate a thresholded probability map by:
  - detecting one or more defects in the SEM image and the aligned rendered image; and
  - classifying the one or more defects as a defect-of-interest or a nuisance to produce the thresholded probability map;
- perform dynamic compensation on the SEM image and the aligned reference image to produce a corrected SEM image and a corrected reference image;
- generate a thresholded defect map by:
  - determining a probability distribution from a difference between the SEM image and the aligned reference image; and
  - applying an signal-to-noise-ratio threshold to the probability distribution to produce the thresholded defect map, the thresholded defect map comprising signal-to-noise-ratio defects defined as locations in the probability distribution exceeding the signal-to-noise-ratio threshold; and
- filter the defects of the thresholded probability map and the signal-to-noise-ratio defects of the thresholded defect map using a broadband plasma broadband-plasma-based property to produce defect-of-interest clusters.

18. The non-transitory, computer-readable storage medium of claim 17, wherein the rendered image is produced by rendering a vector polygon in a design file to the rendered image.

19. The non-transitory, computer-readable storage medium of claim 17, wherein the reference image is generated by modifying the rendered image using a generative adversarial network.

20. The non-transitory, computer-readable storage medium of claim 17, wherein the broadband-plasma-based property includes a location window, a defect size, or a care area type.

* * * * *